United States Patent [19]

Bennett et al.

[11] Patent Number: 5,708,109
[45] Date of Patent: Jan. 13, 1998

[54] PRESSURE SENSITIVE ADHESIVES WITH GOOD OILY SURFACE ADHESION

[75] Inventors: Greggory S. Bennett, Hudson, Wis.; Christopher A. Haak, Oakdale, Minn.

[73] Assignee: Minnesota Mining and Manufacturing Company, St. Paul, Minn.

[21] Appl. No.: 796,393

[22] Filed: Feb. 6, 1997

Related U.S. Application Data

[62] Division of Ser. No. 537,032, Sep. 29, 1995, Pat. No. 5,616,670, which is a continuation of Ser. No. 150,426, Nov. 10, 1993.

[51] Int. Cl.$^6$ ................................................ C08F 218/00
[52] U.S. Cl. .............. 526/307.7; 526/319; 526/282; 526/264; 526/270; 526/273; 526/313; 526/326; 526/318.44
[58] Field of Search ......................... 526/307.7, 319, 526/282, 264, 270, 273, 313, 326, 318.44

[56] References Cited

U.S. PATENT DOCUMENTS

| | | |
|---|---|---|
| Re. 24,906 | 12/1960 | Ulrich . |
| 3,312,754 | 4/1967 | Marks et al. . |
| 3,340,224 | 9/1967 | Sherman et al. . |
| 3,406,087 | 10/1968 | Potter . |
| 3,491,070 | 1/1970 | Weaver . |
| 3,740,366 | 6/1973 | Sanderson et al. . |
| 3,922,464 | 11/1975 | Silver et al. . |
| 4,092,443 | 5/1978 | Green . |
| 4,181,752 | 1/1980 | Martens et al. . |
| 4,199,646 | 4/1980 | Hori et al. . |
| 4,223,067 | 9/1980 | Levens . |
| 4,243,500 | 1/1981 | Glennon . |
| 4,247,656 | 1/1981 | Janssen . |
| 4,252,593 | 2/1981 | Green . |
| 4,303,485 | 12/1981 | Levens . |
| 4,329,384 | 5/1982 | Vesley et al. . |
| 4,330,590 | 5/1982 | Vesley . |
| 4,335,171 | 6/1982 | Zenk . |
| 4,364,972 | 12/1982 | Moon . |
| 4,379,201 | 4/1983 | Heilmann et al. . |
| 4,391,687 | 7/1983 | Vesley . |
| 4,404,246 | 9/1983 | Charbonneau et al. . |
| 4,415,615 | 11/1983 | Esmay et al. . |
| 4,418,105 | 11/1983 | Stratton . |
| 4,418,120 | 11/1983 | Kealy et al. . |
| 4,421,822 | 12/1983 | Levens . |
| 4,447,579 | 5/1984 | Takagi et al. . |
| 4,503,200 | 3/1985 | Corley . |
| 4,513,039 | 4/1985 | Esmay . |
| 4,522,870 | 6/1985 | Esmay . |
| 4,548,862 | 10/1985 | Hartman . |
| 4,552,604 | 11/1985 | Green . |
| 4,557,960 | 12/1985 | Vernon et al. . |
| 4,590,230 | 5/1986 | Kamada et al. . |
| 4,599,265 | 7/1986 | Esmay . |
| 4,612,209 | 9/1986 | Forgo et al. . |
| 4,612,242 | 9/1986 | Vesley et al. . |
| 4,618,525 | 10/1986 | Chamberlain et al. . |

(List continued on next page.)

FOREIGN PATENT DOCUMENTS

| | | |
|---|---|---|
| 252717 | 1/1988 | European Pat. Off. . |
| 0 303 430 A1 | 2/1989 | European Pat. Off. . |
| 0444354 A2 | 9/1991 | European Pat. Off. . |
| 0511860 A1 | 11/1992 | European Pat. Off. . |
| 0 546 746 A1 | 6/1993 | European Pat. Off. . |
| 57-172906 | 10/1982 | Japan . |
| 10680 | 1/1988 | Japan . |
| 64-87667 | 3/1989 | Japan . |
| 1-261479 | 10/1989 | Japan . |
| 1-315409 | 12/1989 | Japan . |
| 2-202571 | 8/1990 | Japan . |
| 3-292379 | 12/1991 | Japan . |
| 4-103685 | 4/1992 | Japan . |
| 4-114079 | 4/1992 | Japan . |
| 4-255779 | 9/1992 | Japan . |
| 5-310810 | 11/1993 | Japan . |
| A 05 045 518 | 2/1994 | Japan . |
| 6-128544 | 5/1994 | Japan . |
| 833-995 | 7/1979 | U.S.S.R. . |
| WO 91/14461 | 10/1991 | WIPO . |
| WO 92/02577 | 2/1992 | WIPO . |
| WO 92/15651 | 9/1992 | WIPO . |
| WO 93/13147 | 7/1993 | WIPO . |
| WO 93/13148 | 7/1993 | WIPO . |

OTHER PUBLICATIONS

Disclosure re Samples Sent Out.
(Chem Abs: 118:60863y) Li, Shu Sheng, "Oil Absorptive Adhesives", *Zhanjie*, 1991, vol. 112, No. 6, pp. 10–22.
Fedors, Robert F., "A Method for Estimating Both the Solubility Parameters and Molar Volumes of Liquids", *Polymer Engineering and Science*, Feb., 1974, vol. 14, No. 2, pp. 147–154.
Official Gaz. 1046 TMOG2, Sep. 4, 1984 (Listed on Examiner's 892 form).

*Primary Examiner*—Joseph L. Schofer
*Assistant Examiner*—N. Sarofim
*Attorney, Agent, or Firm*—Gary L. Griswold; Walter N. Kirn; Steven E. Skolnick

[57] ABSTRACT

A pressure sensitive adhesive that includes the polymerization product of:

(a) 25–97 parts by weight of an acrylic acid ester of a monohydric alcohol whose homopolymer has a $T_g$ less than 0° C.;

(b) 3–75 parts by weight of a non-polar ethylenically unsaturated monomer whose homopolymer has a solubility parameter of no greater than 10.50 and a $T_g$ greater than 15° C.; and (c) 0–5 parts by weight of a polar ethylenically unsaturated monomer whose homopolymer has a solubility parameter of greater than 10.50 and a $T_g$ greater than 15° C. The relative amounts of the acrylic acid ester, the non-polar ethylenically unsaturated monomer, and the polar ethylenically unsaturated monomer are chosen such that the 90° peel adhesion of the pressure sensitive adhesive to a surface provided with 1.5±0.25 mg/in$^2$ oil is greater than zero after a 10 second dwell at room temperature as measured according to Test Procedure B.

30 Claims, No Drawings

U.S. PATENT DOCUMENTS

| | | |
|---|---|---|
| 4,619,867 | 10/1986 | Charbonneau et al. |
| 4,619,979 | 10/1986 | Kotnour et al. |
| 4,645,711 | 2/1987 | Winslow et al. |
| 4,666,771 | 5/1987 | Vesley et al. |
| 4,673,673 | 6/1987 | Laurent et al. |
| 4,673,750 | 6/1987 | Beers et al. |
| 4,693,935 | 9/1987 | Mazurek. |
| 4,699,842 | 10/1987 | Jorgensen et al. |
| 4,710,536 | 12/1987 | Klingen et al. |
| 4,731,273 | 3/1988 | Bonk et al. |
| 4,737,559 | 4/1988 | Kellen et al. |
| 4,748,061 | 5/1988 | Vesley. |
| 4,749,590 | 6/1988 | Klingen et al. |
| 4,751,269 | 6/1988 | Bonk et al. |
| 4,780,491 | 10/1988 | Vesley et al. |
| 4,818,610 | 4/1989 | Zimmerman et al. |
| 4,880,683 | 11/1989 | Stow. |
| 4,895,745 | 1/1990 | Vesley et al. |
| 4,950,537 | 8/1990 | Vesley et al. |
| 4,988,742 | 1/1991 | Moon et al. |
| 5,013,784 | 5/1991 | Yang. |
| 5,024,880 | 6/1991 | Vesley et al. |
| 5,028,484 | 7/1991 | Martin et al. |
| 5,086,088 | 2/1992 | Kitano et al. |
| 5,102,924 | 4/1992 | Williams et al. |
| 5,106,902 | 4/1992 | Yang. |
| 5,130,375 | 7/1992 | Bernard et al. |
| 5,141,989 | 8/1992 | Jung et al. |
| 5,147,938 | 9/1992 | Kuller. |
| 5,156,911 | 10/1992 | Stewart. |
| 5,164,441 | 11/1992 | Yang. |
| 5,262,232 | 11/1993 | Wilfong et al. |
| 5,278,199 | 1/1994 | Ohkawa et al. |
| 5,284,891 | 2/1994 | Wouters et al. |
| 5,308,887 | 5/1994 | Ko et al. |

PRESSURE SENSITIVE ADHESIVES WITH GOOD OILY SURFACE ADHESION

This is a divisional of application Ser. No. 08/537,032, filed Sep. 29, 1995, U.S. Pat. No. 5,616,670, which is a continuation of Ser. No. 08/150,426 filed Nov. 10, 1993.

CROSS REFERENCE TO RELATED APPLICATIONS

This application is related to the following concurrently filed applications, all of which are assigned to the same assignee as the present application and are hereby incorporated by reference: Bennett et al. "Pressure Sensitive Thermosetting Adhesives," U.S. Ser. No. 08/150,417, filed Nov. 10, 1993, abandoned, Bennett et al., "Tackified Pressure Sensitive Adhesives," U.S. Ser. No. 08/150,408, filed Nov. 10, 1993; abandoned and Bennett et al., "Pressure Sensitive Adhesives With Good Low Energy Surface Adhesion," U.S. Ser. No. 08/150,425, filed Nov. 10, 1993, abandoned.

BACKGROUND OF THE INVENTION

Field of the Invention

This invention relates to pressure sensitive adhesives.

Description of the Background Art

Acrylate pressure sensitive adhesives are well known in the art. Many of these adhesives are copolymers of an alkyl ester of acrylic acid and a minor portion of a polar co-monomer. Due to the presence of the polar co-monomer these adhesives generally do not adhere well to low energy and oily surfaces (e.g., surfaces having a critical surface tension of wetting of no greater than about 35 dynes/cm).

SUMMARY OF THE INVENTION

In general, the invention features a pressure sensitive adhesive that includes the polymerization product of:

(a) 25–97 parts by weight of an acrylic acid ester of a monohydric alcohol whose homopolimer has a $T_g$ less than 0° C.;

(b) 3–75 parts by weight of a non-polar ethylenically unsaturated monomer whose homopolymer has a solubility parameter of no greater than 10.50 and a $T_g$ greater than 15° C.; and (c) 0–5 parts by weight of a polar ethylenically unsaturated monomer whose homopolymer has a solubility parameter of greater than 10.50 and a $T_g$ greater than 15° C. The relative amounts of the acrylic acid ester, the non-polar ethylenically unsaturated monomer, and the polar ethylenically unsaturated monomer are chosen such that the 90° peel adhesion of the pressure sensitive adhesive to a surface provided with 1.5±0.25 mg/in$^2$ oil is greater than zero after a 10 second dwell at room temperature as measured according to Test Procedure B, infra.

The solubility parameter referred to herein is calculated according to the technique described in Fedors, Polym. Eng. and Sci., 14: 147 (1974). A monomer whose homopolymer has a solubility parameter of greater than 10.50 when measured according to the Fedors technique is referred to herein as a polar monomer, whereas a monomer whose homopolymer has a solubility parameter of 10.50 or less when measured according to the Fedors technique is referred to herein as a non-polar monomer.

The invention provides pressure sensitive adhesives which, by virtue of incorporating a non-polar ethylenically unsaturated monomer and limiting the polar monomer content to no more than 5 parts, exhibit good adhesion to oily surfaces. The adhesives are less toxic than, e.g., adhesives containing polar heteroatom acrylates. The adhesives further exhibit good shear properties both at low and high temperatures, particularly when a small amount (no more than 5 parts) of a polar co-monomer is included.

The adhesives offer the further advantage of reduced sensitivity to moisture and reduced tendency to corrode metals such as copper relative to pressure sensitive adhesives containing higher amounts of polar co-monomers. Furthermore, the adhesives interact to a lesser extent with polar additives compared to pressure sensitive adhesives containing higher amounts of polar co-monomers.

Other features and advantages of the invention will be apparent from the following description of the preferred embodiments thereof, and from the claims.

DESCRIPTION OF THE PREFERRED EMBODIMENTS

The pressure sensitive adhesives of this invention display good adhesion to oily surfaces (e.g., oily metal surfaces). Examples of oily surfaces include surfaces provided with mineral oil, emulsion oils, peanut oil, motor oil (e.g., 5W-30), WD40, and Ferricote 61 A US (Quaker Chemical Co.) (a common protectant for cold rolled steel). The 90° peel adhesion to a surface provided with 1.5±0.25 mg/in$^2$ oil after a 10 second dwell at room temperature is greater than zero, preferably at least 2 oz./0.5 in., and more preferably at least 4 oz/0.5 in. measured according to Test Procedure B, infra. After a 1 minute dwell, the adhesion preferably builds to at least 5 oz/0.5 in. and more preferably to at least 10 oz/0.5 in. measured according to Test Procedure B, infra. The adhesives also display good cohesive strength properties as measured by the shear strength. Preferably, the shear strength at both room temperature and 70° C. is greater than 50 minutes, more preferably greater than 300 minutes, and even more preferably greater than 600 minutes. These properties are achieved by controlling the monomeric composition to achieve the appropriate polarity (as measured by the solubility parameter of the homopolymers of the individual monomers determined according to the Fedors technique) and rheological properties ($T_g$ as measured by the 1 radian/second tan delta maximum temperature of the adhesive polymer).

A list of several common monomers and their respective Fedors' solubility parameters is shown in Table 1. Table 1 is subdivided into four sections: low Tg acrylate monomers, high $T_g$ acrylate monomers, high Tg methacrylate monomers, and vinyl monomers.

TABLE 1

| FEDORS' SOLUBILITY PARAMETERS | |
|---|---|
| Repeat Unit | Solubility Parameter (cal/cm$^3$)$^{0.5}$ |
| Octadecyl acrylate (ODA) | 8.99 |
| Lauryl acrylate (LA) | 9.15 |
| Iso-octyl acrylate (IOA) | 9.22 |
| 2-ethylhexyl acrylate (2-EHA) | 9.22 |
| Butyl acrylate (BA) | 9.77 |
| Propyl acrylate (PA) | 9.95 |
| Ethyl acrylate (EA) | 10.20 |
| 3,3,5 trimethylcyclohexyl acrylate (TMCA) | 9.35 |
| Iso-bornyl acrylate (IBA) | 9.71 |

TABLE 1-continued

FEDORS' SOLUBILITY PARAMETERS

| Repeat Unit | Solubility Parameter (cal/cm$^3$)$^{0.5}$ |
|---|---|
| Cyclohexyl acrylate (CHA) | 10.16 |
| N-octyl acrylamide (NOA) | 10.33 |
| Tetrahydrofurfuryl acrylate (THFA) | 10.53 |
| Methyl acrylate (MA) | 10.56 |
| Glycidyl acrylate (GA) | 11.32 |
| 2-Phenoxyethylacrylate (2-PhEA) | 11.79 |
| N-vinylcaprolactam (NVC) | 12.10 |
| N,N,-Dimethylacrylamide (DMA) | 12.32 |
| N-vinyl-2-pyrrolidone (NVP) | 13.38 |
| Acrylic Acid (AA) | 14.04 |
| Methylmethacrylate (MMA) | 9.93 |
| Ethylmethacrylate (EMA) | 9.72 |
| Propylmethacrylate (PMA) | 9.57 |
| Vinyl Acetate | 10.56 |
| Styrene | 11.87 |

The rheological character of the adhesive polymer can be partially but usefully described by the $T_g$ as measured by the 1 radian/second tan delta maximum temperature. It is preferable for the $T_g$ as measured by the 1 radian/second tan delta maximum temperature of the polymer to have a value between –45° C. and 15° C., more preferably between –35° C. and 0° C., and even more preferably between —30° C. and –5° C.

The adhesives according to the invention having the requisite polarity and rheological properties contain 25–97 parts (more preferably 40–85 parts) of an acrylic acid ester whose homopolymer has a $T_g$ less than 0° C. (more preferably less than –20° C.), 3–75 parts (more preferably 15–60 parts) of a non-polar ethylenically unsaturated monomer whose homopolymer has a $T_g$ greater than 15° C., and 0–5 parts (more preferably 0–3 parts) of a polar ethylenically unsaturated monomer whose homopolymer has a $T_g$ greater than 15° C.

The acrylic acid ester is a monofunctional acrylic ester of a monohydric alcohol having from about 4 to about 18 carbon atoms in the alcohol moiety whose homopolymer has a $T_g$ less than 0° C. Included in this class of acrylic acid esters are isooctyl acrylate, 2-ethylhexyl acrylate, isononyl acrylate, isodecyl acrylate, decyl acrylate, lauryl acrylate, hexyl acrylate, butyl acrylate, and octadecyl acrylate, or combinations thereof. In the case of octadecyl acrylate, the amount is chosen such that side chain crystallization does not occur at room temperature.

The non-polar ethylenically-unsaturated monomer is a monomer whose homopolymer has a solubility parameter as measured by the Fedors method of not greater than 10.50 and a $T_g$ greater than 15° C. The non-polar nature of this monomer improves the oily surface adhesion of the adhesive. It also improves the structural properties of the adhesive (e.g., cohesive strength) relative to a homopolymer of the acrylic acid ester described above. Examples of suitable non-polar monomers include 3,3,5 trimethylcyclohexyl acrylate, cyclohexyl acrylate, isobornyl acrylate, N-octyl acrylamide, t-butyl acrylate, methyl methacrylate, ethyl methacrylate, and propyl methacrylate or combinations thereof.

The adhesive may contain a limited quantity (e.g., no more than 5 parts) of a polar ethylenically unsaturated monomer whose homopolymer has a solubility parameter as measured by the Fedors method of greater than 10.50 and a $T_g$ greater than 15° C. to improve structural properties (e.g., cohesive strength). It is not desirable to include more than 5 parts of the polar monomer because the polar monomer impairs oily surface adhesion. Examples of suitable polar monomers include acrylic acid, itaconic acid, certain substituted acrylamides such as N,N dimethylacrylamide, N-vinyl- 2-pyrrolidone, N-vinyl caprolactam, acrylonitrile, tetrahydrofurfuryl acrylate, glycidyl acrylate, 2-phenoxyethylacrylate, and benzylacrylate, or combinations thereof.

The monomer mixture can be polymerized by various techniques, with photoinitiated bulk polymerization being preferred. An initiator is preferably added to aid in polymerization of the monomers. The type of initiator used depends on the polymerization process. Photoinitiators which are useful for polymerizing the acrylate monomers include benzoin ethers such as benzoin methyl ether or benzoin isopropyl ether, substituted benzoin ethers such as 2-methyl-2-hydroxylpropiophenone, aromatic sulfonyl chlorides such as 2-naphthalenesulfonyl chloride, and photoactive oxides such as 1-phenyl-1, 1-propanedione-2-(o-ethoxycarbonyl)oxime. An example of a commercially available photoinitiator is Irgacure™ 651 available from Ciba-Geigy Corporation, having the formula 2,2-dimethoxy-1,2-diphenylethane-1-one). Generally, the photoinitiator is present in an amount of about 0.005 to 1 weight percent based on the weight of the monomers. Examples of suitable thermal initiators include AIBN and peroxides.

The mixture of the polymerizable monomers may also contain a crosslinking agent, or a combination of crosslinking agents, to increase the shear strength of the adhesive. Useful crosslinking agents include substituted triazines such as 2,4,-bis(trichloromethyl)-6-(4-methoxy phenyl)-s-triazine, 2,4-bis(trichloromethyl)-6-(3,4-dimethoxyphenyl)-s-triazine, and the chromophore-substituted halo-s-triazines disclosed in U.S. Pat. Nos. 4,329,384 and 4,330,590 (Vesley) incorporated herein by reference. Other useful crosslinking agents include multifunctional alkyl acrylate monomers such as trimetholpropane triacrylate, pentaerythritol tetra-acrylate, 1,2 ethylene glycol diacrylate, 1,4 butanediol diacrylate, 1,6 hexanediol diacrylate, and 1,12 dodecanol diacrylate. Various other crosslinking agents with different molecular weights between (meth)acrylate functionality would also be useful. Generally, the crosslinker is present in an amount of about 0.005 to 1 weight percent based on the combined weight of the monomers.

Where a foam-like pressure sensitive adhesive tape is desired, a monomer blend containing microspheres may be used. Suitable microspheres are commercially available from Kema Nord Plastics under the trade name "Expancel" and from Matsumoto Yushi Seiyaku under the trade name "Micropearl". When expanded the microspheres have a specific density of approximately 0.02–0.036 g/cc. It is possible to include the unexpanded microspheres in the pressure sensitive adhesive composition and subsequently heat them to cause expansion when they are appropriately processed, but it is generally preferred to mix the expanded microspheres into the adhesive. This process makes it easier to ensure that the hollow microspheres in the final adhesive are substantially surrounded by at least a thin layer of adhesive.

Polymeric microspheres having an average diameter of 10 to 200 micrometers may be blended into the polymerizable composition in amounts from about 15% to about 75% by volume prior to coating. Also useful are glass microspheres having an average diameter of from 5 to 200 micrometers, preferably from about 20 to 80 micrometers. Such microspheres may comprise 5% to 65% by volume of the pressure sensitive adhesive. Both polymeric and glass microspheres are known in the art. The pressure sensitive adhesive layer of the tape should be at least 3 times as thick as the diameter of the microspheres, preferably at least 7 times.

Other tape constructions in which the pressure sensitive adhesives according to the invention are useful include mechanical fasteners such as Dual-Lock™ brand fastener (3M Co., St. Paul, Minn.) and Scotchmate™ brand fastener (3M Co., St. Paul, Minn.). The pressure sensitive adhesives are also useful in vibration damping applications.

Other materials which can be blended with the polymerizable monomers prior to coating include plasticizers, tackifiers, coloring agents, reinforcing agents, fire retardants, foaming agents, thermally conductive agents, electrically conductive agents, post-curing agents, and post-curing agent curatives and their accelerators, and the like.

The pressure sensitive adhesives according to the invention are preferably prepared by photoinitiated bulk polymerization according to the technique described in Martens et al., U.S. Pat. No. 4,181,752, hereby incorporated by reference. The polymerizable monomers and a photoinitiator are mixed together in the absence of solvent and partially polymerized to a viscosity in the range of from about 500 cps to about 50,000 cps to achieve a coatable syrup. Alternatively, the monomers may be mixed with a thixotropic agent such as fumed hydrophilic silica to achieve a coatable thickness. The crosslinking agent and any other ingredients are then added to the prepolymerized syrup. Alternatively, with the exception of the crosslinking agent, these ingredients may be added directly to monomers.

The resulting composition is coated onto a substrate (which may be transparent to ultraviolet radiation) and polymerized in an inert (i.e., oxygen free) atmosphere, e.g., a nitrogen atmosphere by exposure to ultraviolet radiation. Examples of suitable substrates include release liners (e.g., silicone release liners) and tape backings (which may be primed or unprimed paper or plastic). A sufficiently inert atmosphere can also be achieved by covering a layer of the polymerizable coating with a plastic film which is substantially transparent to ultraviolet radiation, and irradiating through that film in air as described in the aforementioned Martens et al. patent using ultraviolet lamps. Alternatively, instead of covering the polymerizable coating, an oxidizable tin compound may be added to the polymerizable syrup to increase the tolerance of the syrup to oxygen as described in U.S. Pat. No. 4,303,485 (Levens). The ultraviolet light source preferably has 90% of the emissions between 280 and 400 nm (more preferably between 300 and 400 nm), with a maximum at 351 nm.

Where multi-layer tape constructions are desirable, one method of construction is multi-layer coating using conventional techniques. For example, the coatings may be applied concurrently (e.g., through a die coater), after which the entire multi-layer structure is cured all at once. The coatings may also be applied sequentially whereby each individual layer is partially or completely cured prior to application of the next layer.

The invention will now be further described by way of the following examples.

EXAMPLES

Test Procedures

Test procedures used in the examples to evaluate pressure sensitive adhesives include the following.

Monomer Conversion Test (Test Procedure A).

The monomer conversion was determined gravimetrically. 3 in. by 3 in. samples were laminated to a piece of aluminum foil, weighed, and placed in a forced air oven at 250° F. for 90 min. Samples were then equilibrated at room temperature and reweighed for weight loss. The percent volatiles was taken to be indicative of the monomer conversion.

90° Peel Adhesion Test (Test Procedure B)

One-half inch wide pieces of samples were cut out and laminated to 5 mil thick anodized aluminum which was 0.625 in. wide. The adhesive thickness was 5 mils. The release liner was then removed from the adhesive and the samples were placed onto either a stainless steel substrate (304 stainless steel with a #7 finish) or a cold rolled steel substrate (20 gauge cold plate CRS 1018 with mill finish). The stainless steel substrate was cleaned prior to application of adhesive by wiping once with acetone and 3 times with heptane. The cold rolled steel substrate was cleaned prior to application of adhesive by wiping once with acetone.

Prior to application of the adhesive, an excess of mineral oil was applied to each cold rolled steel substrate with a small piece of cheese cloth and then removed to leave a coating of oil that was 1.5±0.25 mg/in.$^2$. A free end of the backing to which the adhesive was laminated extended beyond the test substrate so that it could be clamped to a load cell to determine peel strength. The sample was rolled back and forth twice with a 4.5 lb roller to ensure contact between the adhesive and the test substrate. The adhesive was then removed after a given dwell time (10 sec., 1 minute, or 24 hours) at 12"/minute in a 90° peel mode.

The values reported are in oz/0.5 in. and represent the average peel values (based on two tests) obtained between 1 and 4 inches on a 5 inch peel sample. All tests were done at room temperature.

Shear Test Test Procedure C)

One-half inch wide pieces of samples were cut out and laminated to 5 mil thick anodized aluminum which was 0.625 in. wide. This construction was placed on stainless steel panels (304 stainless steel with a #7 finish) that had been cleaned by wiping once with acetone and 3 times with heptane. Placement was such that a 1.0 in.×0.5 in. adhesive sample (adhesive thickness=5 mils) was in contact with the panel. The adhesive sample was rolled back and forth twice with a 4.5 lb roller, with some excess material overhanging the sample for attachment of the weight. The samples were then allowed to dwell for 24 hours before the weight was hung on the samples. The 70° C. samples were further allowed to dwell for an additional 10 minutes in the oven before the weight was applied. For the room temperature samples, a 1000 g weight was used, whereas for the 70° C. samples a 500 g weight was used.

The shear data are reported in minutes until the weight fell and represent the average of two tests.

Phase Separation (Test Procedure D)

The presence or absence of phase separation was judged by the optical clarity of the resulting polyacrylate/tackifier blend. The visual observation of opacity was taken to be indicative of a phase separation.

COMPARTMENT EXAMPLES

Comparative Example C1

94 parts iso-octyl acrylate (IOA) and 6 parts acrylic acid (AA) were mixed together in a jar under a constant nitrogen purge along with 0.4 parts of 2,2-dimethoxy-2-phenylacetophenone photoinitiator (Irgacure™ 651, available from Ciba Geigy Corp.) This mixture was partially polymerized under a nitrogen-rich atmosphere to provide a coatable syrup having a viscosity of about 3000 cps. 0.16 parts of 2,4-bis(trichloromethyl)-6-(3,4-dimethoxyphenyl)-s-triazine and an additional 0.16 parts of Irgacure™ 651 were added to the syrup and it was then knife coated onto a release coated paper backing at a thickness of 5 mils. The resulting coating was then exposed to ultraviolet radiation having a spectral output from 300–400 nm with a maximum at 351 nm in a nitrogen-rich environment. An intensity of about 2.05 mW/cm$^2$ was used for a total dosage of 650 mJ/cm2. The resulting adhesive was then tested according to the test methods listed.

Comparative Examples C2 and C3

Comparative example C2 was prepared in the same way as comparative example C1 except that a premix of 10 parts AA and 90 parts IOA was used. In addition, 0.12 parts triazine was used. Comparative example C3 was prepared in the same way as comparative example C1 except that a premix of 14 parts AA and 86 parts IOA was used.

EXAMPLES

Examples 1–20

Example 1 was prepared in the same way as comparative example C1 except the premix consisted of 25 parts N-octyl acrylamide (NOA) and 75 parts lauryl acrylate (LA). The NDA was heated to about 40° C. prior to syruping and coating. In addition, 0.08 parts of 2,4-bis-trichloromethyl-6-(3,4-dimethoxyphenyl)-s-triazine were added after the premix was partially polymerized.

Example 2 was prepared in the same way as example 1 except that the premix consisted of 35 parts NOA and 65 parts LA. The NOA was heated to about 40° C. prior to syruping and coating. In addition, 0.12 parts of 2,4-bis-trichloromethyl- 6-(3,4-dimethoxyphenyl)-s-triazine were added after the premix was partially polymerized.

Example 3 was prepared in the same way as example 1 except that the premix consisted of 45 parts NOA and 55 parts LA. The NOA was heated to about 40° C. prior to syruping and coating.

Example 4 was prepared in the same way as example 1 except that the premix consisted of 25 parts iso-bornyl acrylate (IBA) and 75 parts IOA.

Example 5 was prepared in the same way as example 1 except that the premix consisted of 30 parts IBA and 70 parts LA.

Example 6 was prepared in the same way as example 1 except that the premix consisted of 40 parts IBA and 60 parts LA. In addition, 0.12 parts of 2,6-bis-trichloromethyl-6-(3, 4-dimethoxyphenyl)-s-triazine were added after the premix was partially polymerized.

Example 7 was prepared in the same way as example 1 except that the premix consisted of 30 parts IBA and 70 parts iso-decyl acrylate (IDA).

Example 8 was prepared in the same way as example 1 except that the premix consisted of 40 parts IBA and 60 parts IDA. In addition, 0.12 parts of 2,4-bis-trichloromethyl-6-(3, 4-dimethoxyphenyl)-s-triazine were added after the premix was partially polymerized.

Example 9 was prepared in the same way as example 1 except that the premix consisted of 40 parts IBA, 15 parts IOA, and 45 parts LA. In addition, 0.12 parts of 2,4-bis-trichloromethyl-6-(3,4-dimethoxyphenyl)-s-triazine were added after the premix was partially polymerized.

Example 10 was prepared in the same way as example 1 except that the premix consisted of 35 parts NOA, 15 parts IOA, and 50 parts LA. The NOA was heated to about 40° C. prior to syruping and coating. In addition, 0.12 parts of 2,4-bis-trichloromethyl-6-(3,4-dimethoxyphenyl)-s-triazine were added after the premix was partially polymerized.

Example 11 was prepared in the same way as example 1 except that the premix consisted of 35 parts NOA, 35 parts IOA, and 30 parts LA. The NOA was heated to about 40° C. prior to syruping and coating. In addition, 0.12 parts of 2,4-bis-trichloromethyl-6-(3,4-dimethoxyphenyl)-s-triazine were added after the premix was partially polymerized.

Example 12 was prepared in the same way as example 1 except that the premix consisted of 35 parts NOA, 45 parts IOA, and 20 parts LA. The NOA was heated to about 40° C. prior to syruping and coating. In addition, 0.12 parts of 2,4-bis-trichloromethyl-6-(3,4-dimethoxyphenyl)-s-triazine were added after the premix was partially polymerized.

Example 13 was prepared in the same way as example 1 except that the premix consisted of 35 parts IBA, 15 parts IOA, and 50 parts octadecyl acrylate (ODA). In addition, 0.12 parts of 2,4-bis-trichloromethyl-6-(3,4-dimethoxyphenyl)-s-triazine were added after the premix was partially polymerized.

Example 14 was prepared in the same way as example 1 except that the premix consisted of 35 parts IBA, 35 parts IOA, and 30 parts ODA. In addition, 0.12 parts of 2,4-bis-trichloromethyl-6-(3,4-dimethoxyphenyl)-s-triazine were added after the premix was partially polymerized.

Example 15 was prepared in the same way as example 1 except that the premix consisted of 35 parts IBA, 45 parts IOA, and 20 parts ODA. In addition, 0.12 parts of 2,4-bis-trichloromethyl-6-(3,4-dimethoxyphenyl)-s-triazine were added after the premix was partially polymerized.

Example 16 was prepared in the same way as example 1 except that the premix consisted of 30 parts NOA, 40 parts IOA, and 30 parts ODA. The NOA was heated to about 40° C. prior to syruping and coating. In addition, 0.12 parts of 2,4-bis-trichloromethyl-6-(3,4-dimethoxyphenyl)-s-triazine were added after the premix was partially polymerized.

Example 17 was prepared in the same way as example 1 except that the premix consisted of 67 parts IOA, 32.5 parts IBA, and 0.5 parts AA. In addition, 0.12 parts of 2,4-bis-trichloromethyl-6-(3,4-dimethoxyphenyl)-s-triazine were added after the premix was partially polymerized.

Example 18 was prepared in the same way as example 1 except that the premix consisted of 69 parts IOA, 30 parts IBA, and 1 part AA. In addition, 0.12 parts of 2,4-bis-trichloromethyl-6-(3,4-dimethoxyphenyl)-s-triazine were added after the premix was partially polymerized.

Example 19 was prepared in the same way as example 1 except that the premix consisted of was 71 parts IOA, 27 parts IBA, and 2 parts AA. In addition, 0.12 parts of 2,4-bis-trichloromethyl-6-(3,4-dimethoxyphenyl)-s-triazine were added after the premix was partially polymerized.

Example 20 was prepared in the same way as example 1 except that the premix consisted of 76 parts IOA, 21 parts IRA, and 3 parts AA. In addition, 0.12 parts of 2,4-bis-trichloromethyl-6-(3,4-dimethoxyphenyl)-s-triazine were added after the premix was partially polymerized.

The data of Examples 1–20, as well as comparative examples C1, C2, and C3, are shown in Table 2. The designation "DNS" means the adhesive did not stick to the substrate. The designation "nt" means not tested.

TABLE 2

| Example | Stainless Steel Peel Strength 24 Hour | 10 Second Peel Cold Rolled Steel | 1 Min Peel Cold Rolled Steel | RT Shear Minutes | 70° C. Shear Minutes | Percent Conversion |
|---|---|---|---|---|---|---|
| 1 | 24.1 | 8.6 | 14.3 | 68 | nt | >97 |
| 2 | 31.4 | 6.2 | 11.8 | 169 | nt | >97 |
| 3 | 52.7 | 6.7 | 12.2 | 381 | nt | >97 |
| 4 | 42.4 | 4.3 | 11.9 | 292 | nt | >97 |
| 5 | 20.5 | 2.3 | 15.5 | 30 | nt | >97 |
| 6 | 27.0 | 5.8 | 10.1 | 214 | nt | >97 |
| 7 | 38.2 | 6.5 | 11.6 | 243 | nt | >97 |
| 8 | 44.2 | 4.0 | 10.4 | 741 | nt | >97 |
| 9 | 37.3 | 3.7 | 10.7 | 185 | nt | >97 |
| 10 | 32.3 | 6.5 | 12.4 | 135 | nt | >97 |
| 11 | 43.0 | 5.4 | 11.6 | 210 | nt | >97 |
| 12 | 42.9 | 3.8 | 12.3 | 758 | nt | >97 |
| 13 | 11.5 | 2.8 | 10.3 | 12 | nt | >97 |
| 14 | 13.4 | 5.1 | 10.8 | 177 | nt | >97 |
| 15 | 20.3 | 5.2 | 8.6 | 186 | nt | >97 |
| 16 | 22.5 | 5.1 | 7.7 | 195 | nt | >97 |
| 17 | 36.0 | A.1 | 6.0 | 997 | 10K+ | >97 |
| 18 | 38.7 | 3.1 | 6.5 | 1465 | 10K+ | >97 |
| 19 | 47.7 | 1.0 | 4.3 | 8318 | 10K+ | >97 |
| 20 | 39.1 | 0.8 | 2.0 | 10K+ | 10K+ | >97 |
| C1 | 51.2 | 0(DNS) | 0(DNS) | 10K+ | nt | >97 |
| C2 | 37.6 | 0(DNS) | 0(DNS) | 10K+ | nt | >97 |
| C3 | 61.5 | 0(DNS) | 0.7 | 10K+ | nt | >97 |

Other embodiments are within the following claims.
What is claimed is:

We claim:

1. A fastener comprising a hook and loop fastener provided with a pressure sensitive adhesive composition,
   said pressure sensitive adhesive composition consisting essentially of a pressure sensitive adhesive polymer consisting of the reaction product of:
   (a) 25–97 parts by weight of an acrylic acid ester of a monohydric alcohol whose homopolymer has a Tg less than 0° C.;
   (b) 3–75 parts by weight of a non-polar ethylenically unsaturated monomer whose homopolymer has a solubility parameter of no greater than 10.50 and a Tg greater than 15° C.; and
   (c) 0–5 parts by weight of a polar ethylenically unsaturated monomer whose homopolymer has a solubility parameter of greater than 10.50 and a Tg greater than 15° C., the relative amounts of said acrylic acid ester, said non-polar ethylenically unsaturated monomer, and said polar ethylenically unsaturated monomer being chosen such that 90° peel adhesion of said reaction product to a surface provided with 1.5±0.25 mg/in$^2$ oil is greater than zero after a 10 second dwell at room temperature as measured according to Test Procedure B, with the proviso that the composition contains essentially no emulsifier.

2. The fastener of claim 1, wherein the relative amounts of said acrylic acid ester, said non-polar ethylenically unsaturated monomer, and said polar ethylenically unsaturated monomer being chosen such that the shear strength of said reaction product at both room temperature and at 70° C. is greater than 50 minutes as measured according to Test Procedure C.

3. The fastener of claim 1, wherein the 1 radian/second tan delta maximum glass transition temperature of said reaction product is between –45° C. and 15° C., inclusive.

4. The fastener of claim 1, wherein said pressure sensitive adhesive comprises the reaction product of said acrylic acid ester, said non-polar ethylenically unsaturated monomer, and 0 parts by weight of said polar ethylenically unsaturated monomer.

5. The fastener of claim 1, wherein said non-polar ethylenically unsaturated monomer is a monomer other than a methacrylate monomer.

6. The fastener of claim 1, wherein said non-polar ethylenically unsaturated monomer is isobornyl acrylate.

7. The fastener of claim 1, wherein said pressure sensitive adhesive comprises the reaction product of isooctyl acrylate, isobornyl acrylate, and acrylic acid.

8. The fastener of claim 1, wherein said pressure sensitive adhesive comprises the reaction product of isooctyl acrylate and isobornyl acrylate.

9. The fastener of claim 1, wherein said pressure sensitive adhesive comprises the reaction product of isooctyl acrylate, lauryl acrylate, and N-octyl acrylamide.

10. The fastener of claim 1, wherein said pressure sensitive adhesive comprises the reaction product of lauryl acrylate and N-octyl acrylamide.

11. The fastener of claim 1, wherein said pressure sensitive adhesive comprises the reaction product of isodecyl acrylate and isobornyl acrylate.

12. The fastener of claim 1, wherein the pressure sensitive adhesive comprises the reaction product of lauryl acrylate and isobornyl acrylate.

13. The fastener of claim 1, wherein the pressure sensitive adhesive comprises the reaction product of lauryl acrylate, isodecyl acrylate, and isobornyl acrylate.

14. The fastener of claim 1, wherein the pressure sensitive adhesive comprises the reaction product of isooctyl acrylate, octadecyl acrylate, and isobornyl acrylate.

15. The fastener of claim 1, wherein the pressure sensitive adhesive comprises the reaction product of isooctyl acrylate, octadecyl acrylate, and N-octyl acrylamide.

16. A fastener comprising a headed fastener provided with a pressure sensitive adhesive composition, said pressure sensitive adhesive composition consisting essentially of a pressure sensitive polymer consisting of the reaction product of:

(a) 25–97 parts by weight of an acrylic acid ester of a monohydric alcohol whose homopolymer has a Tg less than 0° C.;

(b) 3–75 parts by weight of a non-polar ethylenically unsaturated monomer whose homopolymer has a solubility parameter of no greater than 10.50 and a Tg greater than 15° C.; and (c) 0–5 parts by weight of a polar ethylenically unsaturated monomer whose homopolymer has a solubility parameter of greater than 10.50 and a Tg greater than 15° C., the relative amounts of said acrylic acid ester, said non-polar ethylenically unsaturated monomer, and said polar ethylenically unsaturated monomer being chosen such that 90° peel adhesion of said reaction product to a surface provided with 1.5±0.25 mg/in$^2$ oil is greater than zero after a 10 second dwell at room temperature as measured according to Test Procedure B, with the proviso that the composition contains essentially no emulsifier.

17. The fastener of claim 16, wherein the relative amounts of said acrylic acid ester, said non-polar ethylenically unsaturated monomer, and said polar ethylenically unsaturated monomer being chosen such that the shear strength of said reaction product at both room temperature and at 70° C. is greater than 50 minutes as measured according to Test Procedure C.

18. The fastener of claim 16, wherein the 1 radian/second tan delta maximum glass transition temperature of said reaction product is between −45° C. and 15° C., inclusive.

19. The fastener of claim 16, wherein said pressure sensitive adhesive comprises the reaction product of said acrylic acid ester, said non-polar ethylenically unsaturated monomer, and 0 parts by weight of said polar ethylenically unsaturated monomer.

20. The fastener of claim 16, wherein said non-polar ethylenically unsaturated monomer is a monomer other than a methacrylate monomer.

21. The fastener of claim 16, wherein said non-polar ethylenically unsaturated monomer is isobornyl acrylate.

22. The fastener of claim 16, wherein said pressure sensitive adhesive comprises the reaction product of isooctyl acrylate, isobornyl acrylate, and acrylic acid.

23. The fastener of claim 16, wherein said pressure sensitive adhesive comprises the reaction product of isooctyl acrylate and isobornyl acrylate.

24. The fastener of claim 16, wherein said pressure sensitive adhesive comprises the reaction product of isooctyl acrylate, lauryl acrylate, and N-octyl acrylamide.

25. The fastener of claim 16, wherein said pressure sensitive adhesive comprises the reaction product of lauryl acrylate and N-octyl acrylamide.

26. The fastener of claim 16, wherein said pressure sensitive adhesive comprises the reaction product of isodecyl acrylate and isobornyl acrylate.

27. The fastener of claim 16, wherein the pressure sensitive adhesive comprises the reaction product of lauryl acrylate and isobornyl acrylate.

28. The fastener of claim 16, wherein the pressure sensitive adhesive comprises the reaction product of lauryl acrylate, isodecyl acrylate, and isobornyl acrylate.

29. The fastener of claim 16, wherein the pressure sensitive adhesive comprises the reaction product of isooctyl acrylate, octadecyl acrylate, and isobornyl acrylate.

30. The fastener of claim 16, wherein the pressure sensitive adhesive comprises the reaction product of isooctyl acrylate, octadecyl acrylate, and N-octyl acrylamide.

* * * * *